US010784183B2

(12) United States Patent
Garg et al.

(10) Patent No.: US 10,784,183 B2
(45) Date of Patent: Sep. 22, 2020

(54) SEMICONDUCTOR MODULE WITH PACKAGE EXTENSION FRAMES

(71) Applicant: Infineon Technologies AG, Neubiberg (DE)

(72) Inventors: Pawan Garg, Munich (DE); Mathias Kiele-Dunsche, Neubiberg (DE); Tomas Manuel Reiter, Munich (DE); Christopher Roemmelmayer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/207,001

(22) Filed: Nov. 30, 2018

(65) Prior Publication Data
US 2020/0176351 A1 Jun. 4, 2020

(51) Int. Cl.
H01L 23/40 (2006.01)
H01L 23/498 (2006.01)
H01L 21/52 (2006.01)
H01L 23/544 (2006.01)

(52) U.S. Cl.
CPC ......... H01L 23/4006 (2013.01); H01L 21/52 (2013.01); H01L 23/49838 (2013.01); H01L 23/544 (2013.01); H01L 2023/4087 (2013.01); H01L 2223/54426 (2013.01)

(58) Field of Classification Search
CPC .. H01L 23/49838; H01L 23/544; H01L 21/52
See application file for complete search history.

(56) References Cited

U.S. PATENT DOCUMENTS

| 5,313,099 A | 5/1994 | Tata et al. |
| 5,735,340 A | 4/1998 | Mira et al. |
| 6,191,478 B1 | 2/2001 | Chen |
| 6,777,791 B2* | 8/2004 | Leighton ........... H01L 23/49827 257/678 |
| 7,193,853 B2 | 3/2007 | Chen et al. |
| 8,611,090 B2* | 12/2013 | Sinha ................. H01L 21/563 361/708 |
| 2008/0054442 A1 | 3/2008 | Kanschat et al. |

* cited by examiner

Primary Examiner — Seahvosh Nikmanesh
(74) Attorney, Agent, or Firm — Shumaker & Sieffert, P.A.

(57) ABSTRACT

A semiconductor package includes a semiconductor module, a first package extension frame, a second package extension frame, and a plurality of fasteners. The semiconductor module includes a first side surface, a second side surface, a first major surface, and a second major surface on an opposite side of the semiconductor module from the first major surface. The first package extension frame is configured to attach to the first side surface. The second package extension frame is configured to attach to the second side surface. The plurality of fasteners are configured to mechanically couple the first package extension frame and the second package extension frame to one or more of a circuit board arranged on the first major surface and/or a heat sink arranged on the second major surface.

20 Claims, 15 Drawing Sheets

US 10,784,183 B2

SEMICONDUCTOR MODULE WITH PACKAGE EXTENSION FRAMES

TECHNICAL FIELD

This disclosure relates a semiconductor package configured for connecting with a circuit board.

BACKGROUND

Some semiconductor packages include a semiconductor module having a power transistor and pins for connecting the power transistor to a circuit. Such semiconductor modules are frequently mounted onto a circuit board such that the pins electronically couple to the circuit board to form an electrical circuit. In this way, the semiconductor modules may represent a cost-effective compact design for mounting with a circuit board.

SUMMARY

In general, this disclosure is directed to a semiconductor package design that simplifies a mounting of a semiconductor module onto a circuit board. For example, a semiconductor package may include package extension frames that may be attached to a semiconductor module to mount the semiconductor module to the circuit board. In some examples, the semiconductor module and the package extension frames include alignment holes that when aligned help to ensure that pins of the semiconductor module are aligned with the circuit board.

In one example, a semiconductor package includes a semiconductor module comprising a first side surface, a second side surface, a first major surface, and a second major surface on an opposite side of the semiconductor module from the first major surface, a first package extension frame configured to attach to the first side surface, a second package extension frame configured to attach to the second side surface, and a plurality of fasteners configured to mechanically couple the first package extension frame and the second package extension frame to one or more of a circuit board arranged on the first major surface and/or a heat sink arranged on the second major surface.

In another example, a method includes attaching a first package extension frame to a first side surface of a semiconductor module, attaching a second package extension frame to a second side surface of the semiconductor module, arranging the first package extension frame and the second package extension frame with a circuit board such that a first major surface of the semiconductor module faces the circuit board, arranging the first package extension frame and the second package extension frame with a heat sink such that a second major surface of the semiconductor module faces the heat sink, mechanically coupling, with one or more fasteners, the first package extension frame to one or more of the circuit board and/or the heat sink, and mechanically coupling, with the one or more fasteners, the second package extension frame to one or more of the circuit board and/or the heat sink.

In another example, a semiconductor package includes a semiconductor module comprising a first side surface, a second side surface, a first major surface, and a second major surface on an opposite side of the semiconductor module from the first major surface, a first package extension frame attached to the first side surface, a second package extension frame attached to the second side surface, a circuit board arranged on the first major surface, a heat sink arranged on the second major surface, and a plurality of fasteners mechanically coupling the first package extension frame and the second package extension frame to one or more of the circuit board or the heat sink.

Details of these and other examples are set forth in the accompanying drawings and the description below. Other features, objects, and advantages will be apparent from the description and drawings, and from the claims.

DETAILED DESCRIPTION

In some systems, a semiconductor package may include metal wings that hold a semiconductor module onto a circuit board and/or heat sink. However, the addition of metal wings adds a process step and thus added cost to the package manufacturing. Moreover, a cost for package manufacturing may be increased for semiconductor packages using metal wings compared to semiconductor packages that omit metal wings to accommodate the presence of dedicated holes for the metal wings, to accommodate additional package features (e.g., slits, grooves, etc.), and/or special assembly steps for handling by automated robots. Moreover, a complexity for package manufacturing may be increased for semiconductor packages using metal wings to accommodate electrical coupling steps to help to ensure proper alignment of the module and to accommodate a specific mounting order during the assembly process to avoid stress on the circuit board (e.g., printed circuit board (PCB)) and the semiconductor module (e.g., pins of the semiconductor module) compared to semiconductor packages that omit metal wings. Further, the metal wings fix the location of the mounting screws, which may create a lack of flexibility and customizability of mounting of the circuit board and/or of the heatsink.

Rather than relying on metal wings, examples described herein may use package extension frames. Package extension frames may assist with handling and assembly. For example, package extension frames may help to: (1) provide easy coupling and/or decoupling for robot handling and optical inspection; (2) remove sequence constraints of the current mounting process; (3) help with pre-alignment; and (4) reduce a number of fasteners (e.g., screws) in the semiconductor package compared to semiconductor packages that rely on metal wings. Moreover, package extension frames may reduce an assembly cost compared to semiconductor packages that rely on metal wings. In yet another example, package extension frames may reduce the number of mounting holes compared to semiconductor packages that rely on metal wings. This reduction of the number of mounting holes could be a significant advantage in applications requiring ingress protection where the space or location for holes is limited. In addition, package extension frames may help to eliminate the need to have pre-defined mounting holes (e.g., defined by semiconductor manufacturers through metal wings) and provide adequate mounting force to ensure a mechanical and thermal connection. Further, package extension frames may help to uniformly distribute mounting force.

Figure 1A:
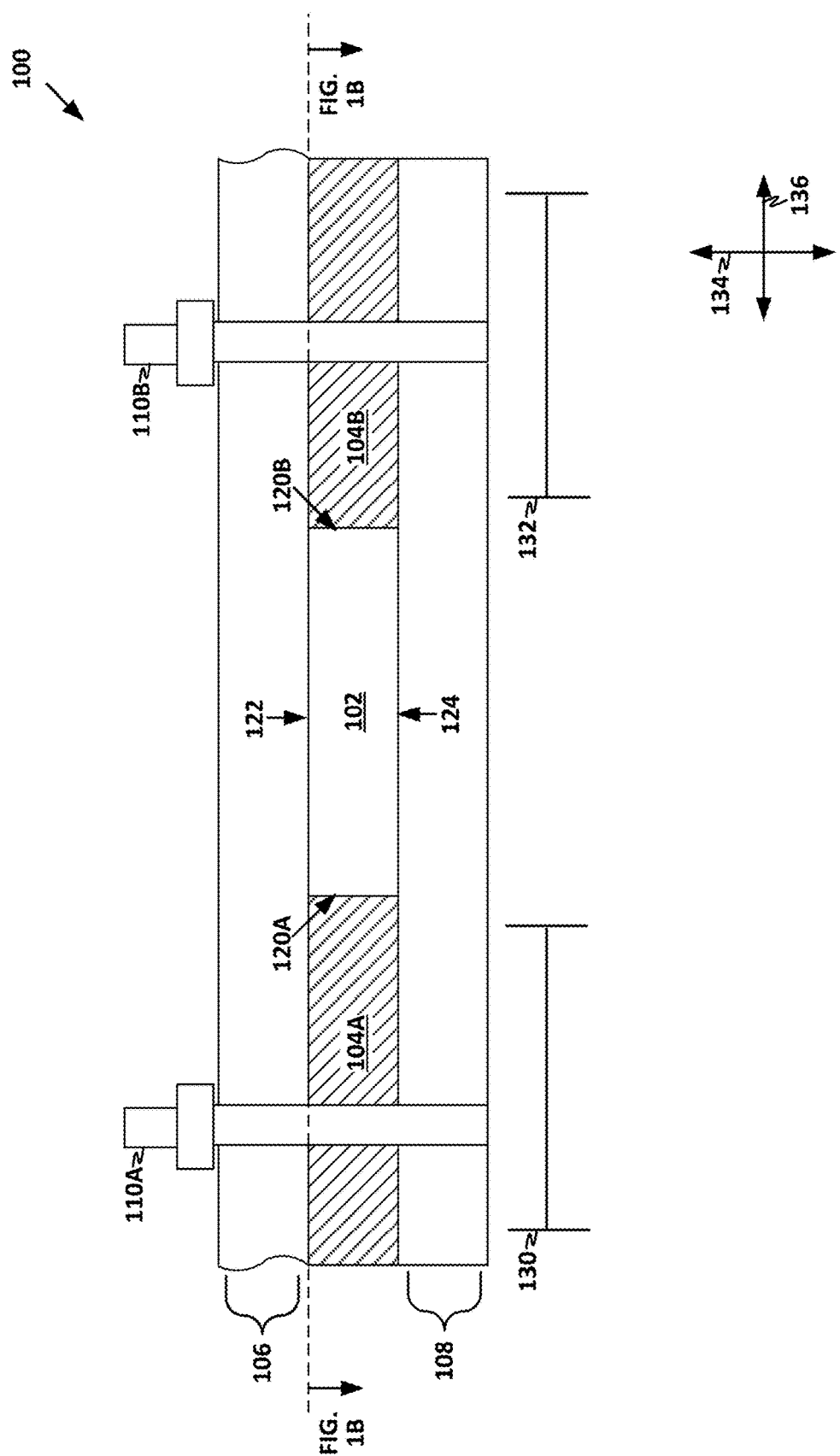
FIG. 1A is a conceptual diagram illustrating a first cross-sectional view of a semiconductor package for simplified mounting, in accordance with one or more techniques of this disclosure.

FIG. 1A is a conceptual diagram illustrating a first cross-sectional view of a semiconductor package 100 for simplified mounting, in accordance with one or more techniques of this disclosure. As illustrated in this example of FIG. 1, semiconductor package 100 may include semiconductor module 102, and package extension frames 104A and 104B (collectively, "package extension frames 104"), circuit board 106, heat sink 108, and fasteners 110A-110B (collectively, "fasteners 110"). Although FIG. 1A illustrates semiconductor package 100 having two package extension frames 104, in some examples, semiconductor package 100 may include three of four package extension frames 104.

Semiconductor module 102 may include a switching element. Examples of switching elements may include, but are not limited to, silicon controlled rectifier (SCR), a Field Effect Transistor (FET), and bipolar junction transistor (BJT). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. Examples of BJTs may include, but are not limited to, PNP, NPN, heterojunction, or any other type of BJT, or any combination of the same. It should be understood that switching elements may be a high side switch or low side switch. Additionally, switching elements may be voltage-controlled and/or current-controlled. Examples of current-controlled switching elements may include, but are not limited to, gallium nitride (GaN) MOSFETs, BJTs, or other current-controlled elements.

Semiconductor module 102 may include one or more passive elements. Examples of passive elements may include, but are not limited to, resistors, capacitors, inductors, transformers, or other passive elements. Semiconductor module 102 may include processing circuitry. For example, semiconductor module 102 may include a microcontroller on a single integrated circuit containing a processor core, memory, inputs, and outputs. For example, semiconductor module 102 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry.

Semiconductor module 102 may comprise a multichip module. A multichip module may include, for example, multiple (e.g., two or more) single integrated circuits. In some examples, the single integrated circuits may be electronically coupled together and/or to one or more pins of semiconductor module 102. In some examples, the multichip module may include one or more passive elements electronically coupled to the single integrated circuits.

Package extension frames 104 may be configured to attach to side surfaces 120A-120B (collectively, "side surfaces 120") of semiconductor module 102. For example, package extension frame 104A may be configured to attach to side surface 120A of semiconductor module 102. In some examples, package extension frame 104B may be configured to attach to side surface 120B of semiconductor module 102. Although not shown in FIG. 1A, a third package extension frame may be configured to attach to a third side surface of semiconductor module 102 and/or a fourth package may be configured to attach to a fourth side surface of semiconductor module 102. Package extension frames 104 may be formed of any suitable material, for example, but not limited to, polymers, metals, combinations of polymers and metals, or other materials.

Circuit board 106 may be configured with components for an electrical circuit. In some examples, circuit board 106 is a PCB. For example, circuit board 106 may include one or more traces, one or more vias (also known as vertical interconnect access), pin receptacles for connecting with devices outside circuit board 106, embedded components, and/or other components for an electrical circuit. Circuit board 106 may include a single layer. In some examples, circuit board 106 may include multiple layers.

Heat sink 108 may comprise any suitable heat exchanger that transfers heat generated by semiconductor module 102 to another medium. Heat sink 108 may comprise a thermally conductive material (e.g., copper, aluminum, etc.). Heat sink 108 may include a surface exposed to air. In some examples, heat sink 108 may be fan-cooled. Heat sink 108 may include a surface exposed to a liquid coolant. Although not shown, a thermal adhesive or thermal grease may be formed between heat sink 108 and semiconductor module 102 to fill air gaps and help to transfer heat generated by semiconductor module 102 away from semiconductor package 100.

Fasteners 110 may be configured to mechanically couple package extension frames 104 to one or more of circuit board 106 and/or heat sink 108. For example, fastener 110A may be configured to mechanically couple package extension frame 104A to one or more of circuit board 106 and/or heat sink 108. Similarly, fastener 110B may be configured to mechanically couple package extension frame 104B to one or more of circuit board 106 and/or heat sink 108. Although not shown in FIG. 1A, a third fastener may be configured to mechanically couple a third package extension frame to one or more of circuit board 106 and/or heat sink 108 and/or a fourth fastener may be configured to mechanically couple a fourth package extension frame to one or more of circuit board 106 and/or heat sink 108. Fasteners 110 may be formed of any suitable material, for example, but not limited to, polymers, metals, combinations of polymers and metals, or other materials. Fasteners 110 may include, for example, but not limited to, nuts, bolts, screws, rivets, clasps, clips, pins, pegs, nails, anchors, staples, and other fasteners.

Figure 1B:
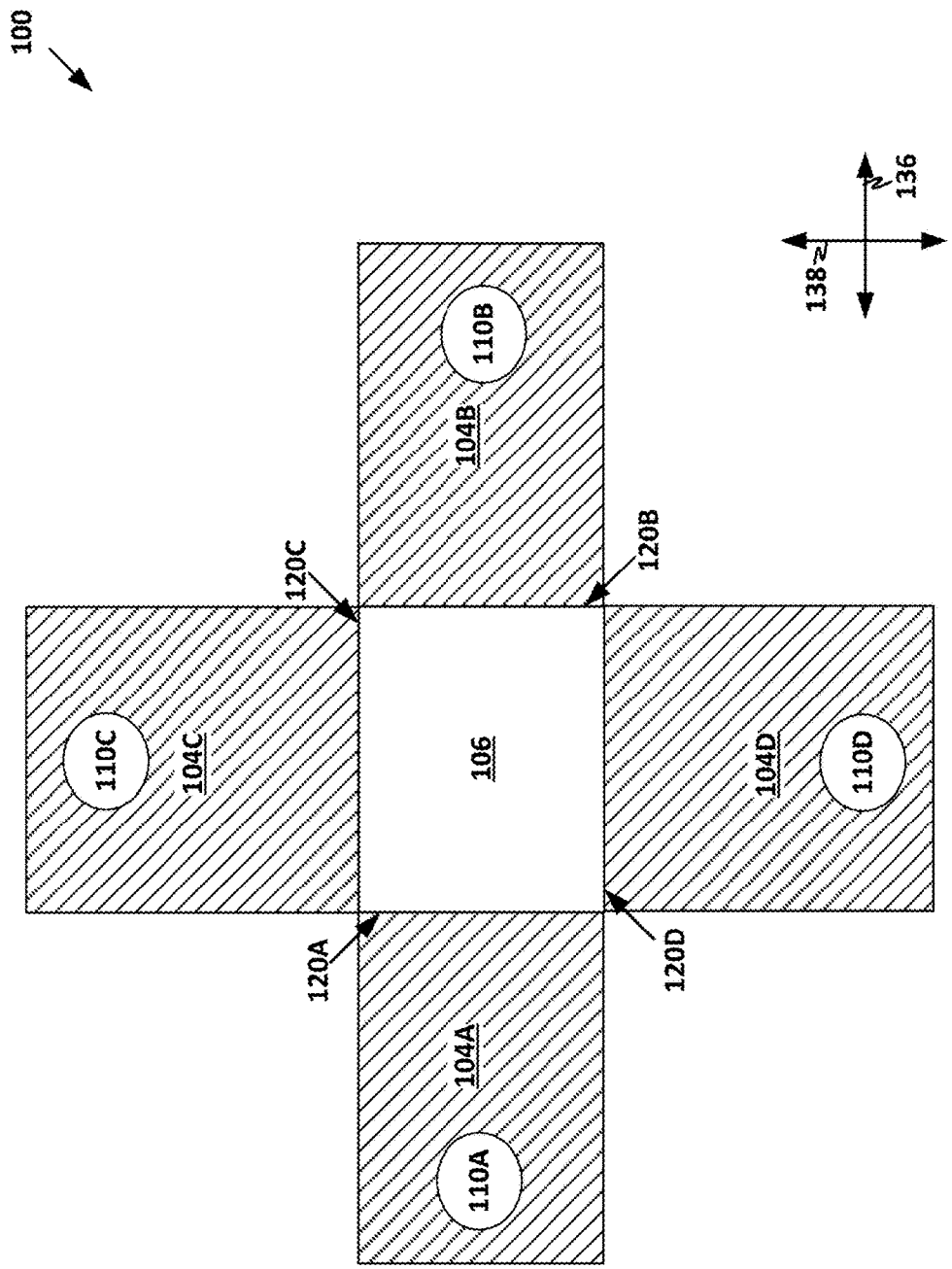
FIG. 1B is a conceptual diagram illustrating a second cross-sectional view of the semiconductor package of FIG. 1A, in accordance with one or more techniques of this disclosure.

In accordance with one or more techniques described herein, semiconductor module 102 may comprise first side surface 120A, second side surface 120B, first major surface 122, and second major surface 124. Circuit board 106 may be arranged on first major surface 122. As shown, second major surface 124 is on an opposite side of semiconductor module 102 from first major surface 122. Heat sink 108 may be arranged on second major surface 124. In the example of FIGS. 1A and 1B, semiconductor package 100 is arranged such that side surfaces 120A-120B extend along a vertical direction 134. In this example, semiconductor package 100 is arranged such that first major surface 122 and second major surface 124 extend along horizontal direction 136.

In this example, first package extension frame 104A is configured to attach to first side surface 120A. For example, first package extension frame 104A and first side surface 120A form a fish hook coupling that mechanically couple when pressed together. In some examples, first package extension frame 104A and first side surface 120A form a threaded coupling that mechanically couples when first package extension frame 104A is rotated relative to first side surface 120A. Similarly, second package extension frame 104B is configured to attach to second side surface 120B. For example, second package extension frame 104B and second side surface 120B form a fish hook coupling that mechanically couple when pressed together. In some examples, second package extension frame 104B and second side surface 120B form a threaded coupling that mechanically couples when second package extension frame 104B is rotated relative to first side surface 120B.

In this example, fasteners 110 are configured to mechanically couple first package extension frame 104A and second package extension frame 104B to one or more of circuit board 106 and/or heat sink 108. For example, fasteners 110 may be configured to mechanically couple first package extension frame 104A and second package extension frame 104B to circuit board 106 and heat sink 108. In some examples, fasteners 110 may be configured to mechanically couple first package extension frame 104A and second package extension frame 104B to circuit board 106. In some examples, fasteners 110 may be configured to mechanically couple first package extension frame 104A and second package extension frame 104B to heat sink 108.

Package extension frames 104 may assist with handling and assembly. For example, package extension frames 104 may help to eliminate the need to have pre-defined mounting holes (e.g., defined by semiconductor manufacturers through metal wings). For example, rather than relying on a pre-defined mounting hole that is adjacent to semiconductor module 102 to mount semiconductor module 102 to circuit board 106, package extension frame 104A may permit a mounting hole to be positioned anywhere within region 130. Similarly, package extension frame 104B may permit a mounting hole to be positioned anywhere within region 132. As such, design restraints for positioned the mounting holes for semiconductor package 100 may be relaxed compared to semiconductor packages that use metal wings. In this way, package extension frames 104 may simplify a design of circuit board 106 and/or of heat sink 108, which may reduce a cost for manufacturing semiconductor package 100.

FIG. 1B is a conceptual diagram illustrating a second cross-sectional view of semiconductor package 100 of FIG. 1A, in accordance with one or more techniques of this disclosure. As shown, side surfaces 120 may further include side surfaces 120C and 120D. As shown, semiconductor package 100 is arranged such that side surfaces 120C-120D extend along a second horizontal direction 136.

In some examples, semiconductor package 100 may optionally include third package extension frame 104C configured to attach to third side surface 120C of semiconductor module 102. Similarly, semiconductor package 100 may optionally include fourth package extension frame 104D configured to attach to fourth side surface 120D of semiconductor module 102. Fasteners 110 may optionally include fastener 110C to mechanically couple package extension frame 104C to one or more of circuit board 106 and/or heat sink 108. Additionally, or alternatively, fasteners 110 may optionally include fastener 110D to mechanically couple package extension frame 104D to one or more of circuit board 106 and/or heat sink 108.

Figure 2:
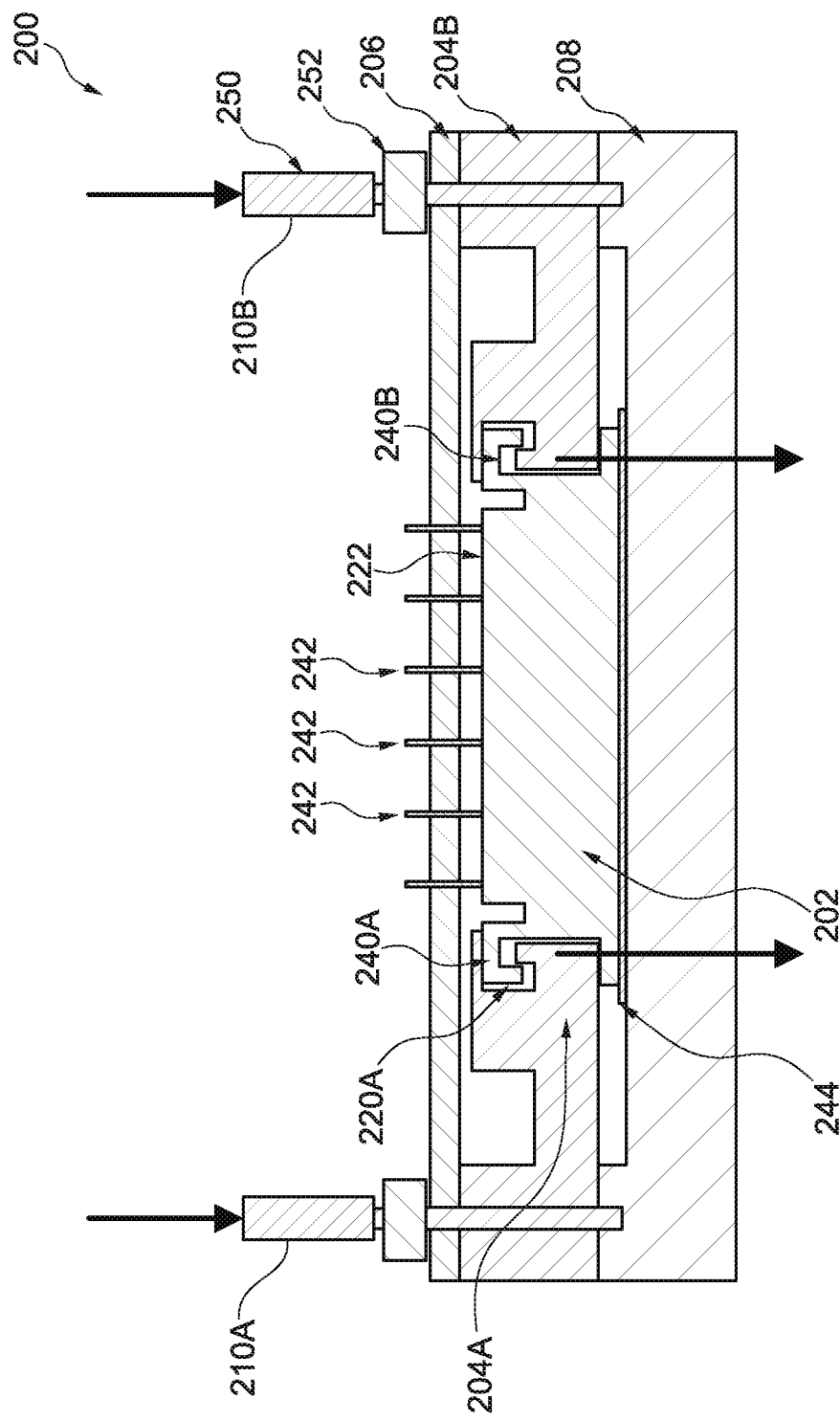
FIG. 2 is a conceptual diagram illustrating a cross-sectional view of further details of a first example of the semiconductor package of FIGS. 1A and 1B, in accordance with one or more techniques of this disclosure.

FIG. 2 is a conceptual diagram illustrating a cross-sectional view of further details of a first example of semiconductor package 100 of FIGS. 1A and 1B, in accordance with one or more techniques of this disclosure. As illustrated, semiconductor package 200 includes semiconductor module 202, and package extension frames 204A and 204B (collectively, "package extension frames 204"), circuit board 206, heat sink 208, and fasteners 210A-210B (collectively, "fasteners 210"). Although FIG. 2 illustrates semiconductor 200 having two package extension frames 204, in some examples, semiconductor package 200 may include three of four package extension frames 204. Semiconductor module 202 may be an example of semiconductor module 102 of FIGS. 1A and 1B. Package extension frames 204 may be examples of package extension frames 104 of FIGS. 1A and 1B. Circuit board 206 may be an example of circuit board 106 of FIGS. 1A and 1B. Heat sink 208 may be an example of heat sink 108 of FIGS. 1A and 1B. Fasteners 210 may be examples of fasteners 110 of FIGS. 1A and 1B. Fastener 210B may include mounting screw 250 and mounting washer 252. As shown, thermal grease 244 may be applied to second major surface 224 of semiconductor module 202.

First side surface 220A of semiconductor module 202 includes a mechanical coupling and first package extension frame 204A includes a complementary mechanical coupling. More specifically, for example, first side surface 220A of semiconductor module 202 includes a mechanical coupling and first package extension frame 204A includes a complementary mechanical coupling that form fish-hook coupling 240A. Similarly, fish-hook coupling 240B may be formed using semiconductor module 202 and second package extension frame 204B. In this example, pressing first package extension frame 204A into first side surface 220A causes fish-hook coupling 240 to couple first package extension frame 204A to first side surface 220A.

Pins 242 may extend away from first major surface 222 of semiconductor module 202 and into pin receptacles of circuit board 206. Pins 242 may include any suitable conductive material such as, for example, but not limited to, one or more conductive elements or one or more conductive alloys. Examples of conductive element may include, but are not limited to, for example, aluminum (AL), copper (Cu), nickel (Ni), titanium (Ti), tungsten (W), another conductive element. Conductive alloys may include, for example, but not limited to, two or more of aluminum (AL), copper (Cu), nickel (Ni), titanium (Ti), tungsten (W), or another conductive element.

Figure 3:
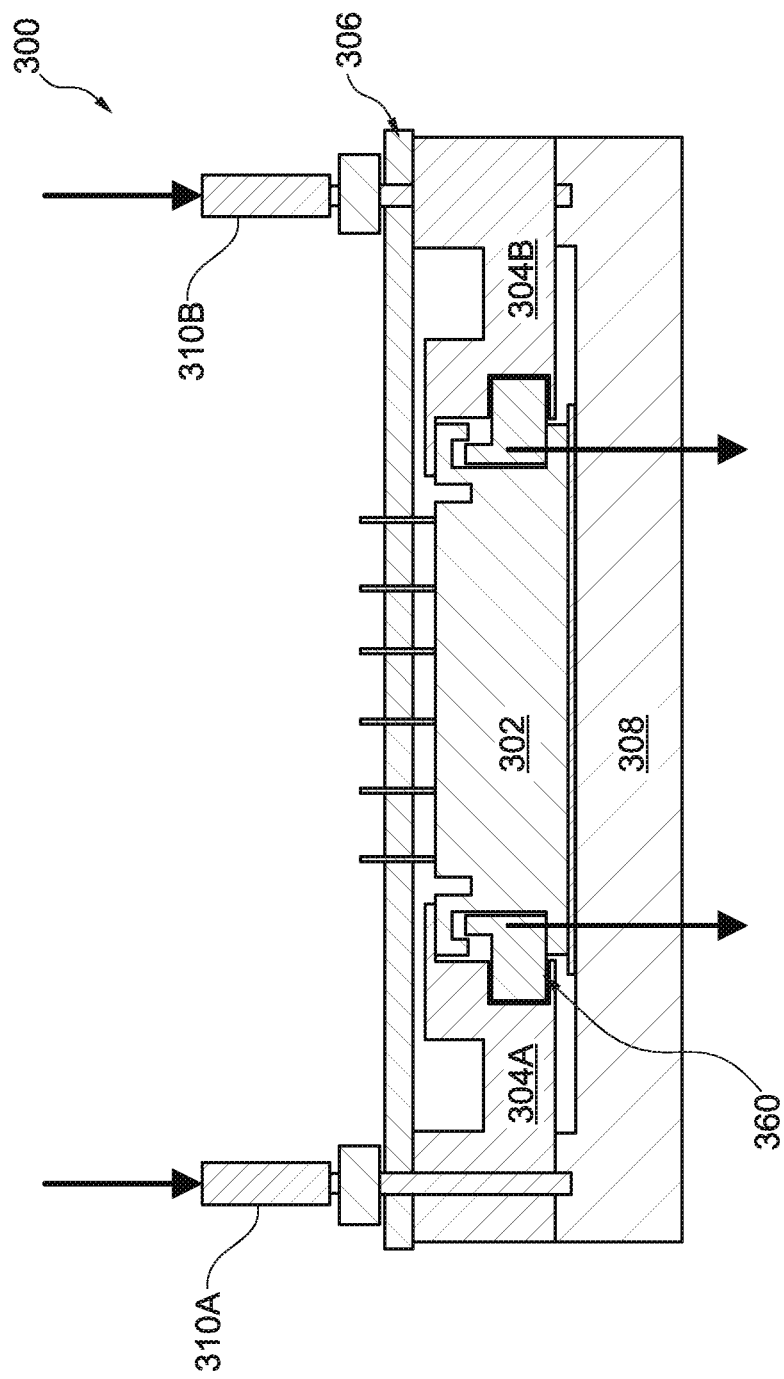
FIG. 3 is a conceptual diagram illustrating a cross-sectional view of further details of a second example of the semiconductor package of FIGS. 1A and 1B, in accordance with one or more techniques of this disclosure.

FIG. 3 is a conceptual diagram illustrating a cross-sectional view of further details of a second example of semiconductor package 100 of FIGS. 1A and 1B, in accordance with one or more techniques of this disclosure. As illustrated, semiconductor package 300 includes semiconductor module 302, and package extension frames 304A and 304B (collectively, "package extension frames 304"), circuit board 306, heat sink 308, and fasteners 310A-310B (collectively, "fasteners 310"). Although FIG. 3 illustrates semiconductor 300 having two package extension frames 304, in some examples, semiconductor package 300 may include three of four package extension frames 304. Semiconductor module 302 may be an example of semiconductor module 102 of FIGS. 1A and 1B. Package extension frames 304 may be examples of package extension frames 104 of FIGS. 1A and 1B. Circuit board 306 may be an example of circuit board 106 of FIGS. 1A and 1B. Heat sink 308 may be an example of heat sink 108 of FIGS. 1A and 1B. Fasteners 310 may be examples of fasteners 110 of FIGS. 1A and 1B.

In the example of FIG. 3, first package extension frame 304A comprises a frame portion 360 formed of a material different from a material of the complementary mechanical coupling. For example, frame portion 360 may be formed of a metal and other portions of first package extension frame 304A may be formed of a polymer. Frame portion 360 may help to allow greater tolerance and less material fatigue over a life-time of semiconductor package 300 compared to semiconductor packages that omit frame portion 360. Further, fame portion 360 may allow and/or provide an alternative coupling technique of the package extension frames 304 to semiconductor module 302.

Figure 4:
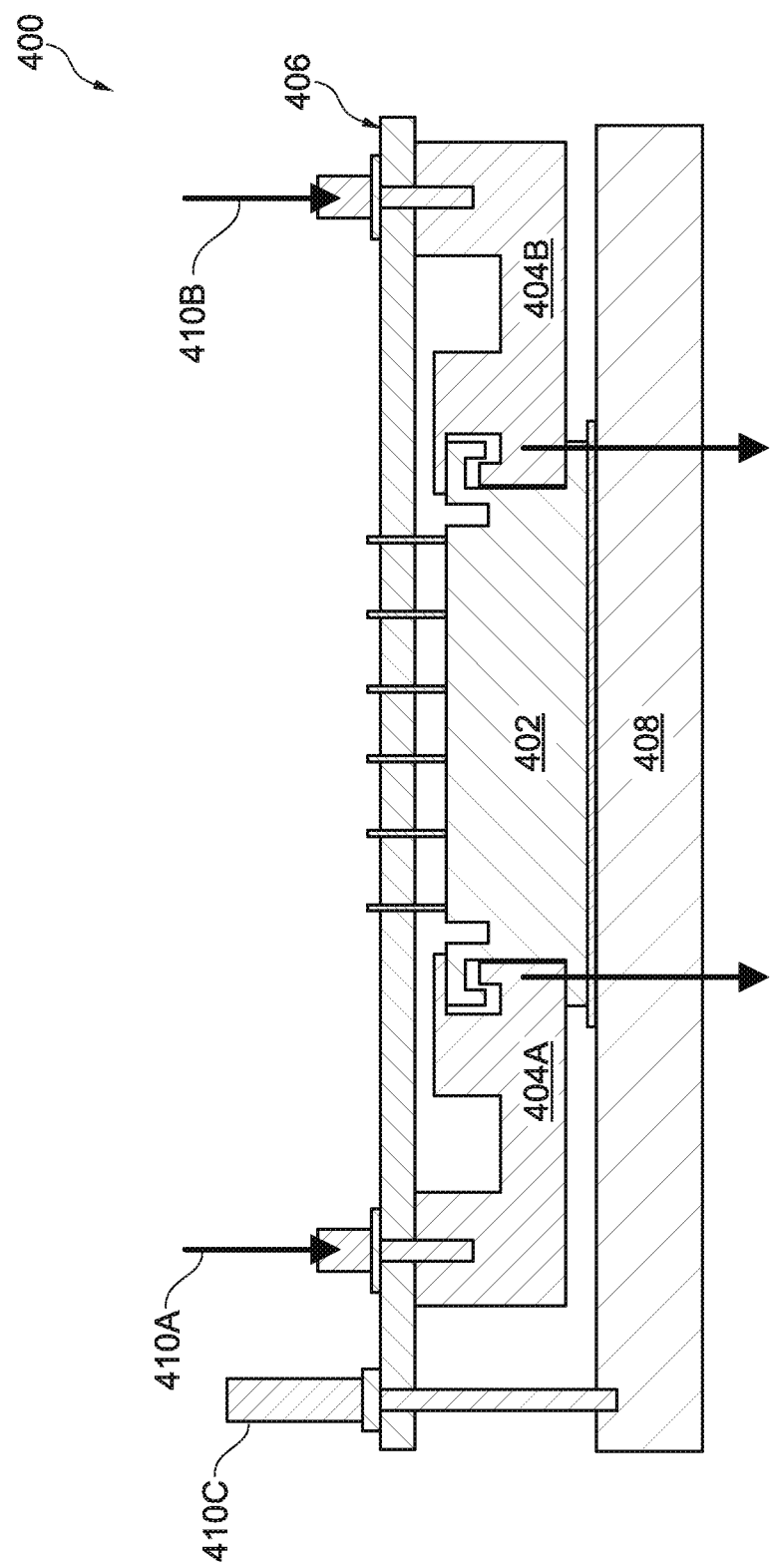
FIG. 4 is a conceptual diagram illustrating a cross-sectional view of further details of a third example of the semiconductor package of FIGS. 1A and 1B, in accordance with one or more techniques of this disclosure.

FIG. 4 is a conceptual diagram illustrating a cross-sectional view of further details of a third example of the semiconductor package of FIGS. 1A and 1B, in accordance with one or more techniques of this disclosure. As illustrated, semiconductor package 400 includes semiconductor module 402, and package extension frames 404A and 404B (collectively, "package extension frames 404"), circuit board 406, heat sink 408, and fasteners 410A-410C (collectively, "fasteners 410"). Although FIG. 4 illustrates semiconductor package 400 having two package extension frames 404, in some examples, semiconductor package 400 may include three of four package extension frames 404. Semiconductor module 402 may be an example of semiconductor module 102 of FIGS. 1A and 1B. Package extension frames 404 may be examples of package extension frames 104 of FIGS. 1A and 1B. Circuit board 406 may be an example of circuit board 106 of FIGS. 1A and 1B. Heat sink 408 may be an example of heat sink 108 of FIGS. 1A and 1B. Fasteners 410 may be examples of fasteners 110 of FIGS. 1A and 1B.

In the example of FIG. 4, fastener 410A is configured to mechanically couple first package extension frame 404 to circuit board 406. In this example, fastener 410C is configured to mechanically couple first package extension frame 404 to heat sink 408.

Figure 5:
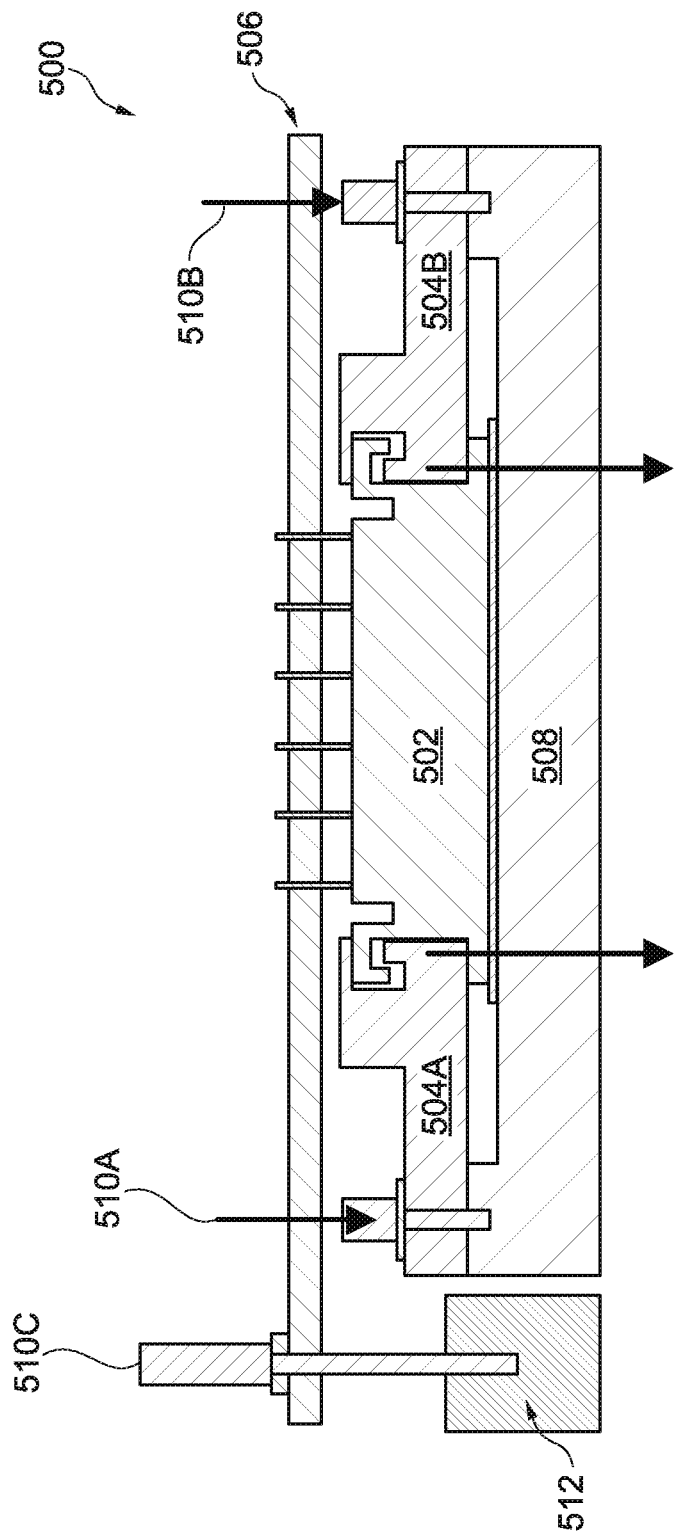
FIG. 5 is a conceptual diagram illustrating a cross-sectional view of further details of a fourth example of the semiconductor package of FIGS. 1A and 1B, in accordance with one or more techniques of this disclosure.

FIG. 5 is a conceptual diagram illustrating a cross-sectional view of further details of a fourth example of semiconductor package 100 of FIGS. 1A and 1B, in accordance with one or more techniques of this disclosure. As illustrated, semiconductor package 500 includes semiconductor module 502, and package extension frames 504A and 504B (collectively, "package extension frames 504"), circuit board 506, heat sink 508, and fasteners 510A-510C (collectively, "fasteners 510"). Although FIG. 5 illustrates semiconductor package 500 having two package extension frames 504, in some examples, semiconductor package 500 may include three of four package extension frames 504. Semiconductor module 502 may be an example of semiconductor module 102 of FIGS. 1A and 1B. Package extension frames 504 may be examples of package extension frames 104 of FIGS. 1A and 1B. Circuit board 506 may be an example of circuit board 106 of FIGS. 1A and 1B. Heat sink 508 may be an example of heat sink 108 of FIGS. 1A and 1B. Fasteners 510 may be examples of fasteners 110 of FIGS. 1A and 1B.

In the example of FIG. 5, fastener 510A is configured to mechanically couple first package extension frame 504A to heat sink 508. Similarly, fastener 510B is configured to mechanically couple second package extension frame 504B to heat sink 508. In this example, fastener 510C is configured to mechanically couple circuit board 506 to mount 512. Mount 512 may be configured for printed circuit board mounting. As shown, mount 512 may be formed of a different material than package extension frame 504 and/or heat sink 508.

Figure 6:
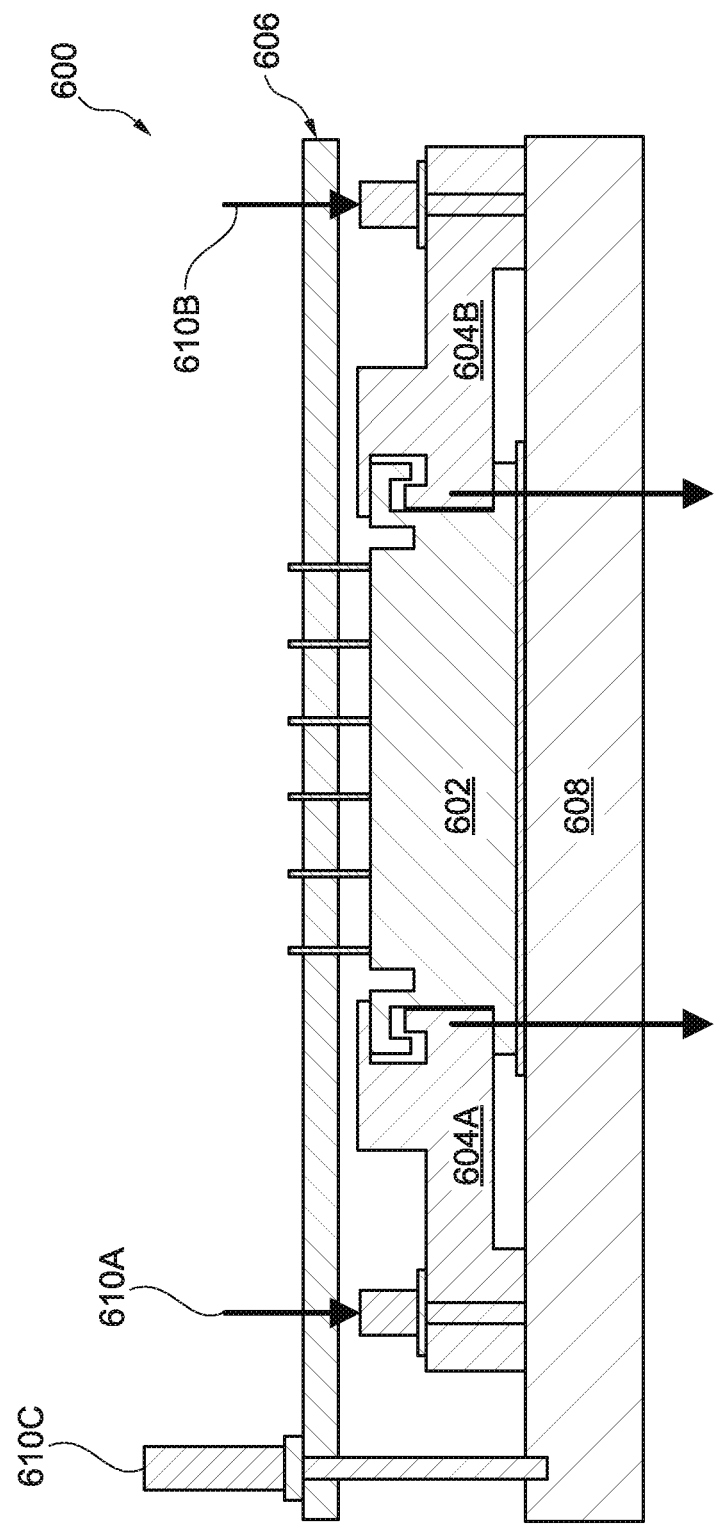
FIG. 6 is a conceptual diagram illustrating a cross-sectional view of further details of a fifth example of the semiconductor package of FIGS. 1A and 1B, in accordance with one or more techniques of this disclosure.

FIG. 6 is a conceptual diagram illustrating a cross-sectional view of further details of a fifth example of semiconductor package 100 of FIGS. 1A and 1B, in accordance with one or more techniques of this disclosure. As illustrated, semiconductor package 600 includes semiconductor module 602, and package extension frames 604A and 604B (collectively, "package extension frames 604"), circuit board 606, heat sink 608, and fasteners 610A-510C (collectively, "fasteners 610"). Although FIG. 6 illustrates semiconductor package 600 having two package extension frames 604, in some examples, semiconductor package 600 may include three of four package extension frames 604. Semiconductor module 602 may be an example of semiconductor module 102 of FIGS. 1A and 1B. Package extension frames 604 may be examples of package extension frames 104 of FIGS. 1A and 1B. Circuit board 606 may be an example of circuit board 106 of FIGS. 1A and 1B. Heat sink 608 may be an example of heat sink 108 of FIGS. 1A and 1B. Fasteners 610 may be examples of fasteners 110 of FIGS. 1A and 1B.

In the example of FIG. 6, fastener 610A is configured to mechanically couple first package extension frame 604A to heat sink 608. Similarly, fastener 610B is configured to mechanically couple second package extension frame 604B to heat sink 608. In this example, fastener 610C is configured to mechanically couple circuit board 606 to heat sink 608.

Figure 7:
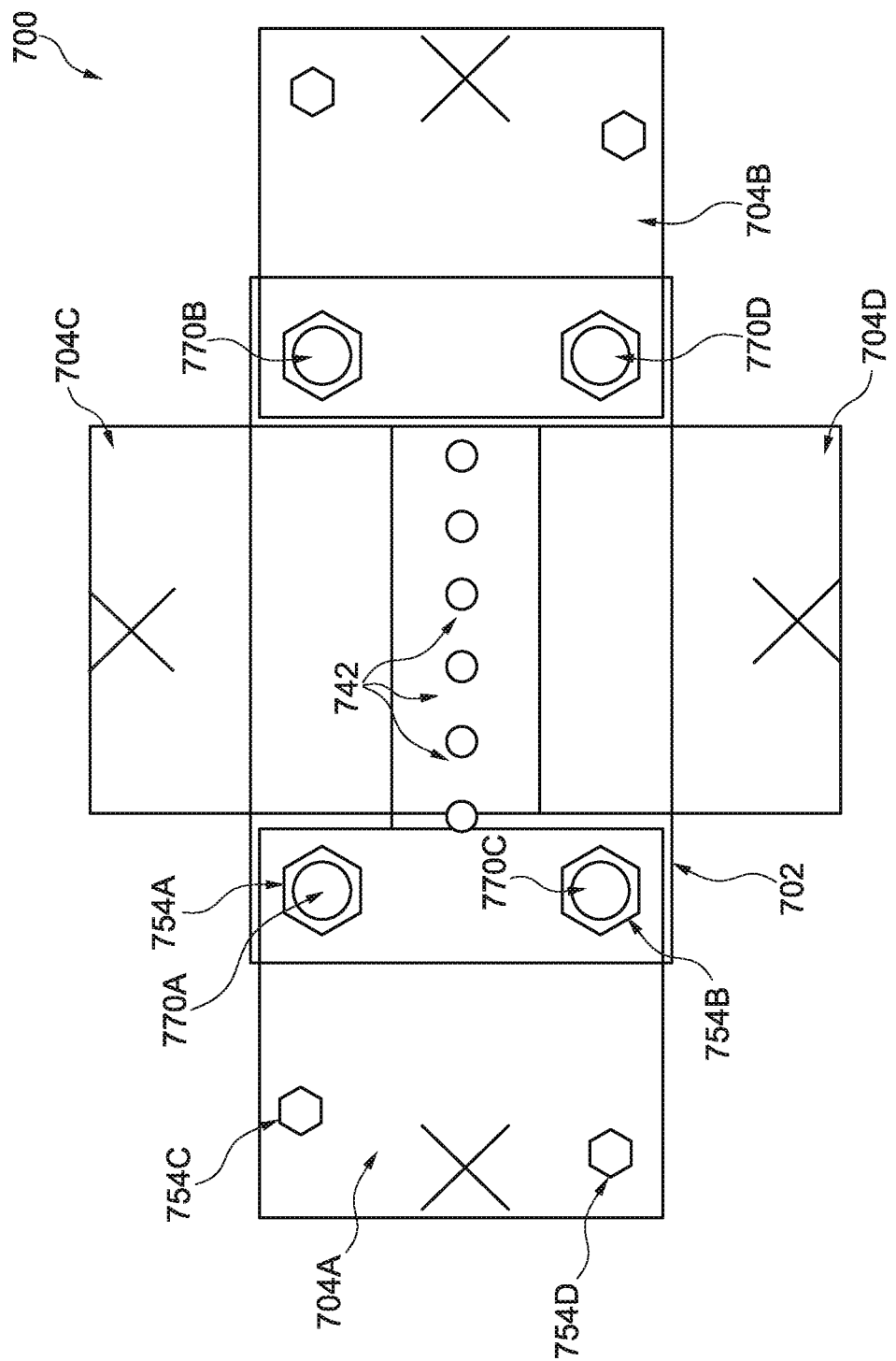
FIG. 7 is a conceptual diagram illustrating a top view of further details of an example of the semiconductor package of FIGS. 1A and 1B, in accordance with one or more techniques of this disclosure.

FIG. 7 is a conceptual diagram illustrating a top view of further details of an example of semiconductor package 100 of FIGS. 1A and 1B, in accordance with one or more techniques of this disclosure. As illustrated, semiconductor package 700 includes semiconductor module 702 and package extension frames 704A-704D (collectively, "package extension frames 704"). Although FIG. 7 illustrates semiconductor package 700 having four package extension frames 704, in some examples, semiconductor package 700 may include two or three package extension frames 704. Semiconductor module 702 may be an example of semiconductor module 102 of FIGS. 1A and 1B. Package extension frames 704 may be examples of package extension frames 104 of FIGS. 1A and 1B. Pins 742 may be an example of pins 242 of FIG. 2.

In the example of FIG. 7, semiconductor package 700 includes semiconductor module alignment holes 770A-770D (collectively, "semiconductor module alignment holes 770). As discussed further with respect to FIGS. 8A-8C, semiconductor module alignment holes 770 may extend through semiconductor module 702. Aligning semiconductor module alignment holes 770 with alignment holes of a circuit board may help to insure that pins 742 are aligned with pin receptacles of the circuit board. In some examples, semiconductor module alignment holes 770 may be omitted and the alignment is done only by using package extension frame (PEF) and PCB alignment holes.

Semiconductor package 700 may include PEF alignment holes 754A-754D (collectively, "PEF alignment holes 754). PEF alignment holes 754A-754D may extend through package extension frame 704A. As shown, PEF alignment holes 754C, 754D may be spaced apart from semiconductor module 702 such that PEF alignment holes 754C, 754D extend through outside surfaces of semiconductor package 700 without corresponding alignment holes of semiconductor module 702. Aligning PEF alignment holes 754 with alignment holes of a circuit board and/or with semiconductor module alignment holes 770 may help to insure that pins 742 are aligned with pin receptacles of the circuit board. As shown, two or more package extension frame (e.g., package extension frames 704A-704B) may each include one or more PEF alignment holes. Moreover, in some examples, three or four package extension frames (e.g., package extension frames 704A-704D) may each include one or more PEF alignment holes.

Figure 8A:
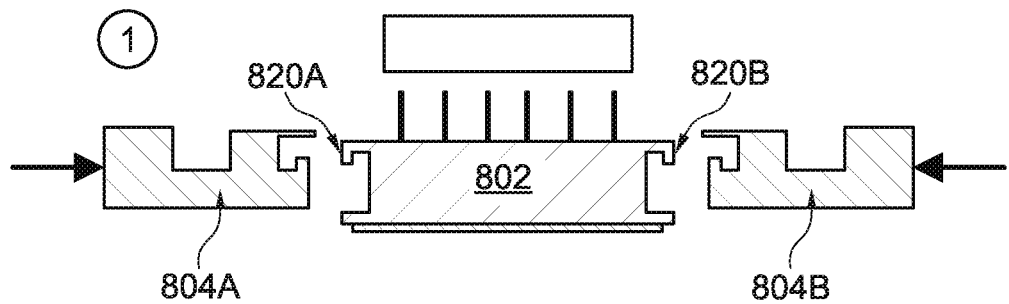
FIGS. 8A-8C are conceptual diagrams illustrating an example method for forming the semiconductor package of FIGS. 1A and 1B, in accordance with one or more techniques of this disclosure.
Figure 8B:
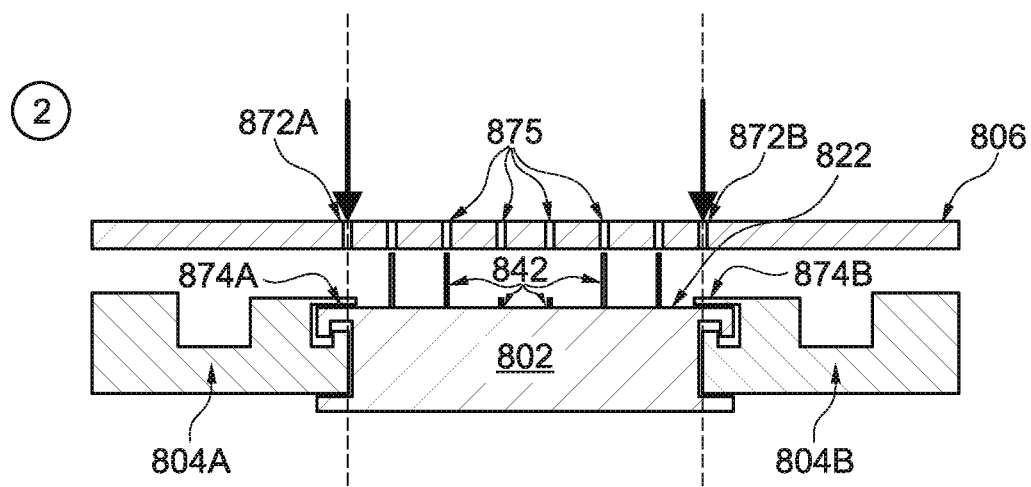
Figure 8C:
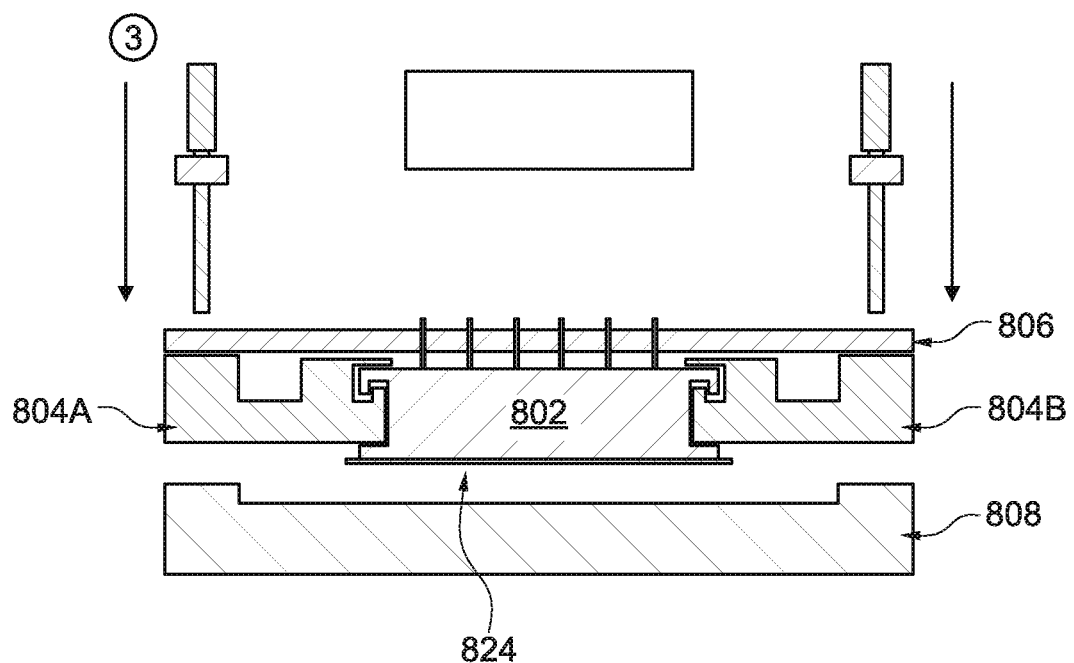

FIGS. 8A-8C are conceptual diagrams illustrating an example method for forming semiconductor package 100 of FIGS. 1A and 1B, in accordance with one or more techniques of this disclosure. FIG. 8A illustrates semiconductor module 802 and package extension frames 804A-804B (collectively, "package extension frames 804"). Although FIG. 8 illustrates attaching two package extension frames 804, some examples may include attaching three or four package extension frames 804. Semiconductor module 802 may be an example of semiconductor module 102 of FIGS. 1A and 1B. Package extension frames 804 may be examples of package extension frames 104 of FIGS. 1A and 1B.

In FIG. 8A, first package extension frame 804A is attached to first side surface 820A of semiconductor module 802. For example, first package extension frame 804A is pressed into first side surface 820A. In some examples, first package extension frame 804A is rotated with respect to first side surface 820A. Similarly, second package extension frame 804A is attached to second side surface 820B of semiconductor module 802. For example, second package extension frame 804B is pressed into second side surface 820B. In some examples, second package extension frame 804B is rotated with respect to second side surface 820B.

In FIG. 8B, first package extension frame 804A and second package extension frame 804B are arranged with circuit board 806 such that first major surface 822 of semiconductor module 802 faces circuit board 806. For example, circuit board 806 comprises one or more alignment holes 872A and one or more alignment holes 872B (collectively, alignment holes 872). In this example, first package extension frame 804A comprises one or more PEF alignment holes 874A, or simply one or more alignment holes 874A. Similarly, second package extension frame 804B may comprise one or more alignment holes 874B. In this example, alignment holes 874A may be aligned with alignment holes 872A. Similarly, alignment holes 874B may be aligned with alignment holes 872B. Aligning alignment holes 874A with alignment holes 872A and/or aligning alignment holes 874B with alignment holes 872B may help to ensure that pins 842 are aligned with pin receptacles 875. Once aligned, first major surface 822 of semiconductor module 802 is fitted (e.g., press fitted, soldered, etc.) into circuit board 806 using first package extension frame 804A and second package extension frame 804B. In some examples, semiconductor module 802 may omit alignment holes. In some examples, however, semiconductor module 802 may include alignment holes.

In FIG. 8C, first package extension frame 804A and second package extension frame 804B are arranged with heat sink 808 such that second major surface 824 of semiconductor module 802 faces heat sink 808. Additionally, first package extension frame 804A is mechanically coupled to one or more of circuit board 806 and/or heat sink 808. For example, first package extension frame 804A is mechanically coupled to circuit board 806 and heat sink 808. Similarly, second package extension frame 804B is mechanically coupled to one or more of circuit board 806 and/or the heat sink 808. For example, second package extension frame 804B is mechanically coupled to circuit board 806 and the heat sink 808.

Figure 9:
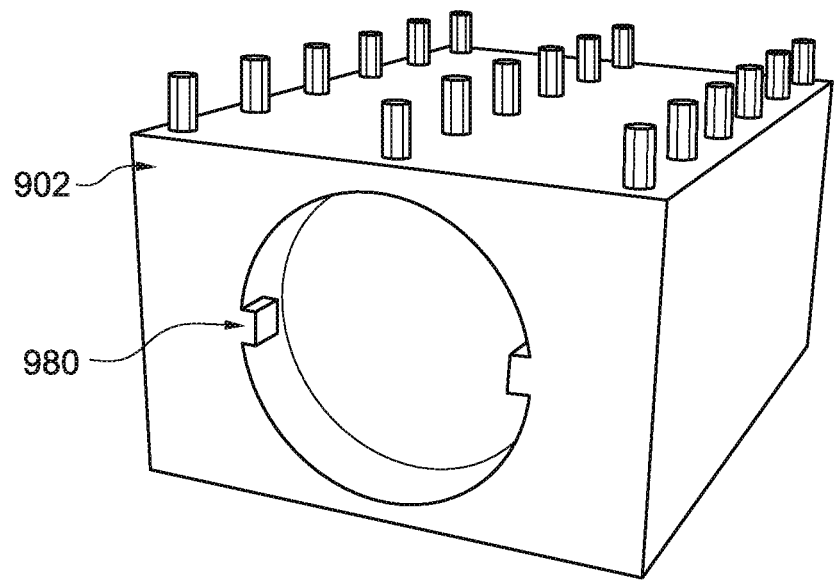
FIG. 9 is a conceptual diagram illustrating a side view of an example semiconductor module of the semiconductor package of FIGS. 1A and 1B, in accordance with one or more techniques of this disclosure.

FIG. 9 is a conceptual diagram illustrating a side view of an example semiconductor module of semiconductor package 100 of FIGS. 1A and 1B, in accordance with one or more techniques of this disclosure. Semiconductor module 902 may be an example of semiconductor module 102 of FIGS. 1A and 1B. In this example, semiconductor module 902 includes a protrusion 980 for mechanical coupling, which is discussed further with respect to FIGS. 10 and 11A-11D.

Figure 10:
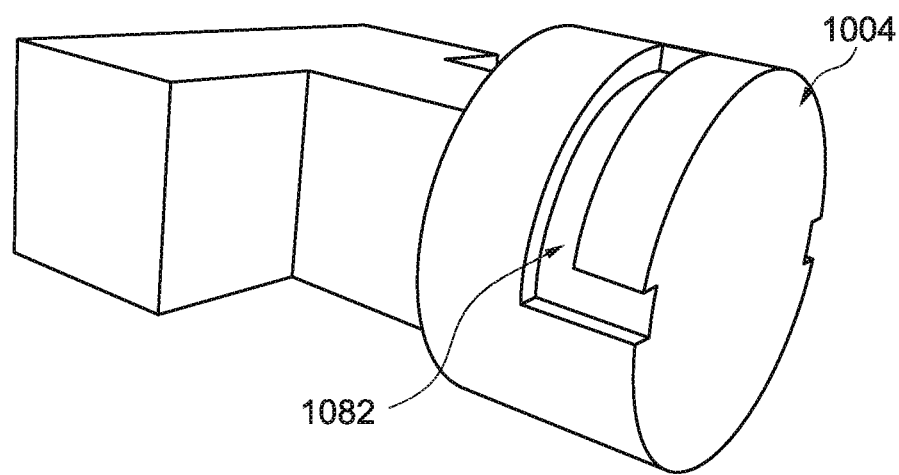
FIG. 10 is a conceptual diagram illustrating a side view of an example package extension frame of the semiconductor package of FIGS. 1A and 1B, in accordance with one or more techniques of this disclosure.

FIG. 10 is a conceptual diagram illustrating a side view of an example package extension frame of the semiconductor package of FIGS. 1A and 1B, in accordance with one or more techniques of this disclosure. Package extension frame 1004 may be examples of package extension frames 104 of FIGS. 1A and 1B. In this example, package extension frame 1004 includes a groove 1082 for mechanically coupling with protrusion 980 of semiconductor module 902 of FIG. 9. In this way, groove 1082 may represent a complementary mechanical coupling to protrusion 980 such that contacting (e.g., rotating) groove 1082 with protrusion 980 couples semiconductor module 902 and package extension frame 1004.

FIGS. 11A-11D are conceptual diagrams illustrating an example method for attaching package extension frame 1004 of FIG. 10 to semiconductor module 902 of FIG. 9, in accordance with one or more techniques of this disclosure.

Figure 11A:
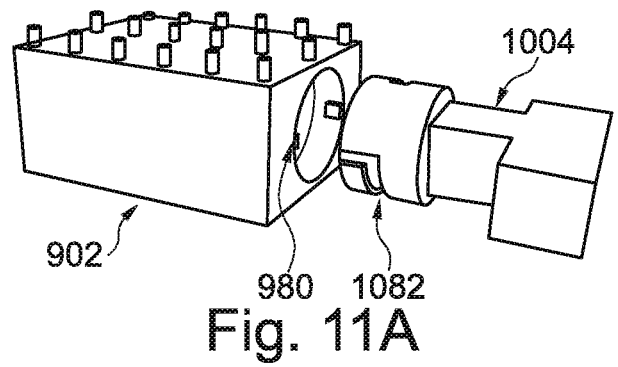
FIGS. 11A-11D are conceptual diagrams illustrating an example method for attaching the package extension frame of FIG. 10 to the semiconductor module of FIG. 9, in accordance with one or more techniques of this disclosure.
Figure 11B:
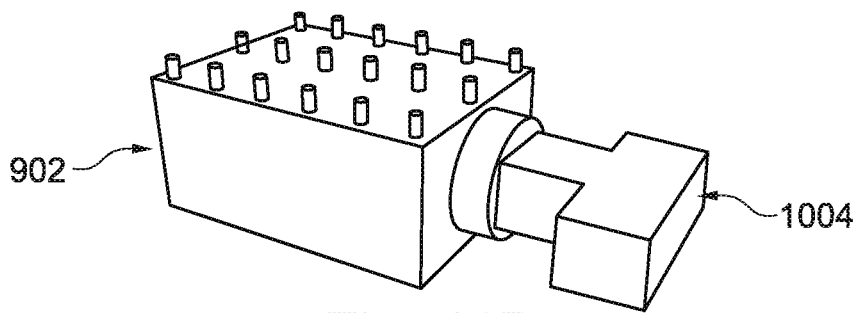
Figure 11C:
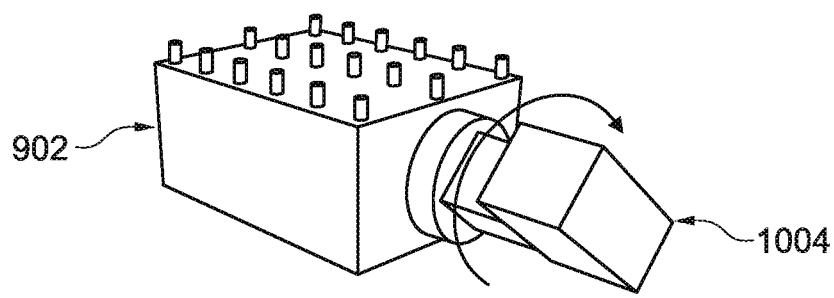
Figure 11D:
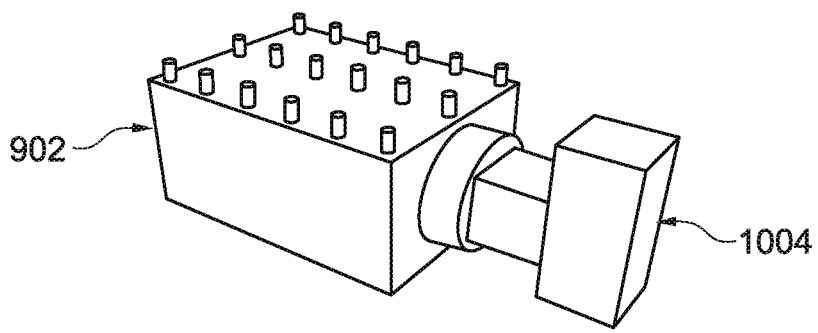

In FIG. 11A, protrusion 980 of semiconductor module 902 is aligned with groove 1082 of package extension frame 1004. In FIG. 11B, semiconductor module 902 is placed in contact with package extension frame 1004. In FIG. 11C, package extension frame 1004 is rotated with respect to semiconductor module 902. FIG. 11D illustrates package extension frame 1004 mechanically coupled with semiconductor module 902.

Figure 12:
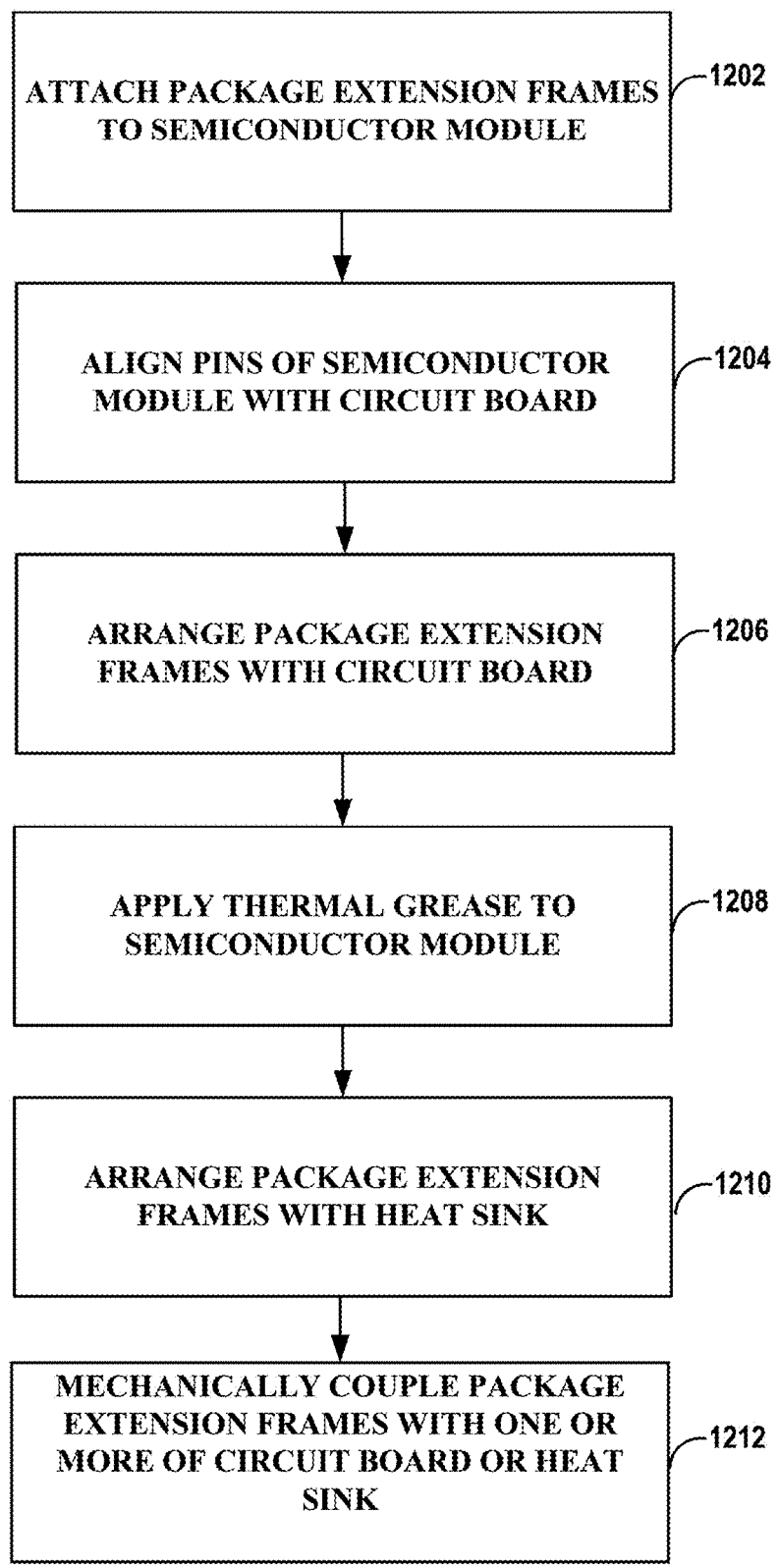
FIG. 12 is a flow diagram for a first method for providing a semiconductor package for simplified mounting, in accordance with one or more techniques of this disclosure.

FIG. 12 is a flow diagram for a first method for providing a semiconductor package for simplified mounting, in accordance with one or more techniques of this disclosure. For purposes of illustration only, FIG. 12 is described below within the context of FIGS. 1A-1B, 2-7, 8A-8C, 9, 10, and 11A-11D.

Initially, the method includes attaching package extension frames to a semiconductor module (1202). For example, package extension frames 804 may be attached using a fish-hook coupling by pressing package extension frames 804 into respective side surfaces 820 of semiconductor module 802. In some examples, package extension frame 1004 is rotated with respect to semiconductor module 902.

The method includes aligning pins of the semiconductor module with a circuit board (1204). For example, alignment holes 874A may be aligned with alignment holes 872A and alignment holes 874B may be aligned with alignment holes 872B. In this example, aligning alignment holes 874A with alignment holes 872A and/or alignment holes 874B with alignment holes 872B may help to ensure that pins 842 are aligned with pin receptacles 875.

The method includes arranging the package extensions frames with the circuit board (1206). For example, first major surface 822 of semiconductor module 802 is press fitted into circuit board 806 using first package extension frame 804A and second package extension frame 804B. The method includes applying thermal grease to the semiconductor module (1208). The method includes arranging the package extensions frames with the heat sink (1210). For example, first package extension frame 804A and second package extension frame 804B are arranged with heat sink 808 such that second major surface 824 of semiconductor module 802 faces heat sink 808.

The method includes mechanically coupling the package extension frames with one or more of the circuit board and/or the heat sink (1212). For example, fasteners 110 may be configured to mechanically couple first package extension frame 104A and second package extension frame 104B to circuit board 106 and heat sink 108. In some examples, fastener 410A is configured to mechanically couple first package extension frame 404 to circuit board 406. In this example, fastener 410C is configured to mechanically couple first package extension frame 404 to heat sink 408. In some examples, fastener 510A is configured to mechanically couple first package extension frame 504 to heat sink 508. In this example, fastener 510C is configured to mechanically couple circuit board 506 to heat sink 508. In some examples, fastener 610A is configured to mechanically couple first package extension frame 604 to heat sink 608. In this example, fastener 610C is configured to mechanically couple circuit board 606 to heat sink 608.

Figure 13:
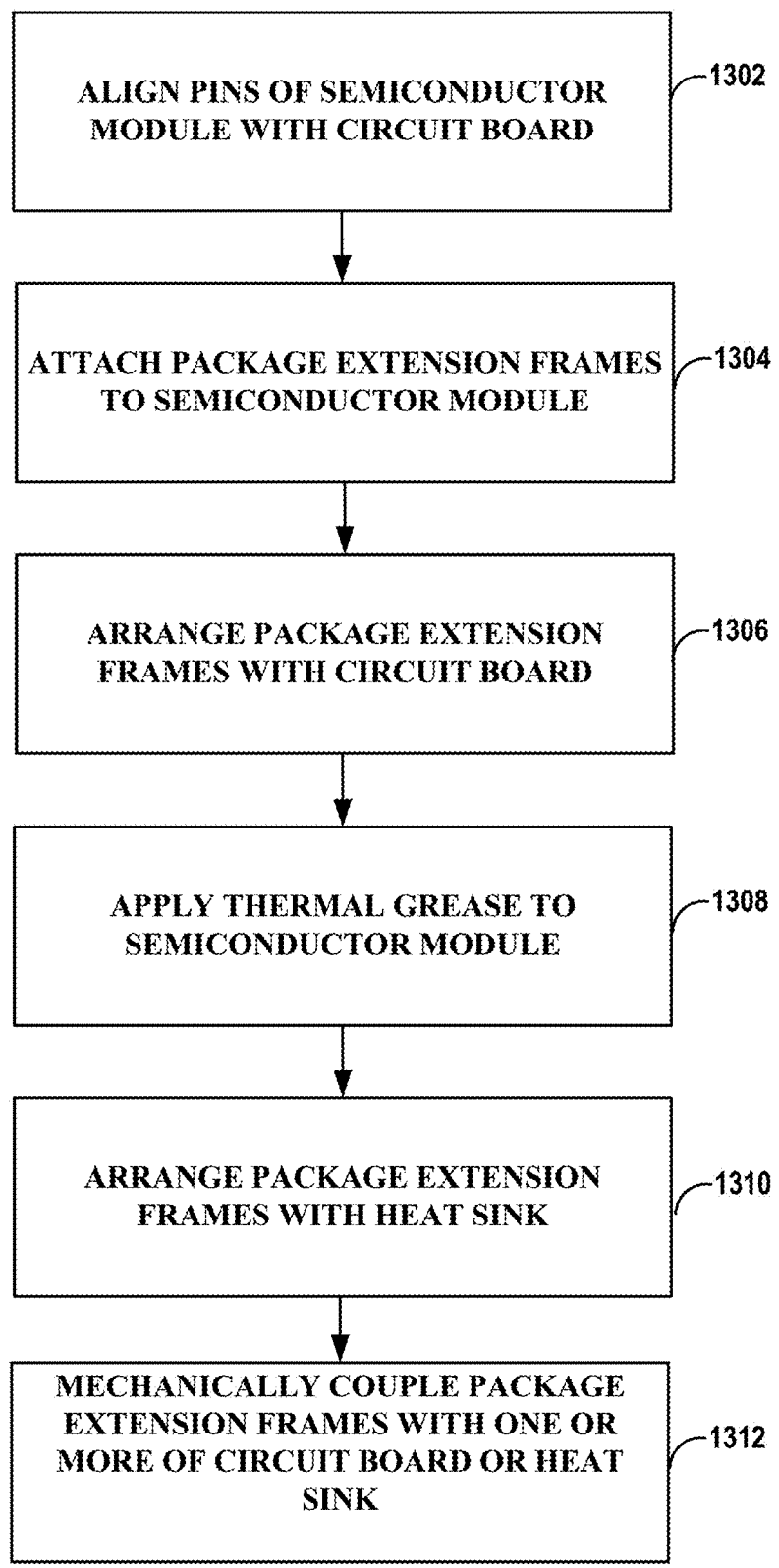
FIG. 13 is a flow diagram for a second method for providing a semiconductor package for simplified mounting, in accordance with one or more techniques of this disclosure.

FIG. 13 is a flow diagram for a second method for providing a semiconductor package for simplified mounting, in accordance with one or more techniques of this disclosure. For purposes of illustration only, FIG. 13 is described below within the context of FIGS. 1A-1B, 2-7, 8A-8C, 9, 10, and 11A-11D.

Initially, the method includes aligning pins of the semiconductor module with a circuit board (1302). For example, alignment holes of semiconductor module 802 may be aligned with alignment holes 872A and alignment holes of semiconductor module 802 may be aligned with alignment holes 872B. In this example, aligning alignment holes of semiconductor module 802 with alignment holes 872A and/or alignment holes 872B may help to ensure that pins 842 are aligned with pin receptacles 875.

The method includes attaching package extension frames to a semiconductor module (1304). For example, package extension frames 804 may be attached using a fish-hook coupling by pressing package extension frames 804 into respective side surfaces 820 of semiconductor module 802. In some examples, package extension frame 1004 is rotated with respect to semiconductor module 902.

The method includes arranging the package extensions frames with the circuit board (1306). For example, first major surface 822 of semiconductor module 802 is press fitted into circuit board 806 using first package extension frame 804A and second package extension frame 804B. The method includes applying thermal grease to the semiconductor module (1308). The method includes arranging the package extensions frames with the heat sink (1310). For example, first package extension frame 804A and second package extension frame 804B are arranged with heat sink 808 such that second major surface 824 of semiconductor module 802 faces heat sink 808.

The method includes mechanically coupling the package extension frames with one or more of the circuit board and/or the heat sink (1312). For example, fasteners 110 may be configured to mechanically couple first package extension frame 104A and second package extension frame 104B to circuit board 106 and heat sink 108. In some examples, fastener 410A is configured to mechanically couple first package extension frame 404 to circuit board 406. In this example, fastener 410C is configured to mechanically couple first package extension frame 404 to heat sink 408. In some examples, fastener 510A is configured to mechanically couple first package extension frame 504 to heat sink 508. In this example, fastener 510C is configured to mechanically couple circuit board 506 to heat sink 508. In some examples, fastener 610A is configured to mechanically couple first package extension frame 604 to heat sink 608. In this example, fastener 610C is configured to mechanically couple circuit board 606 to heat sink 608.

Figure 14:
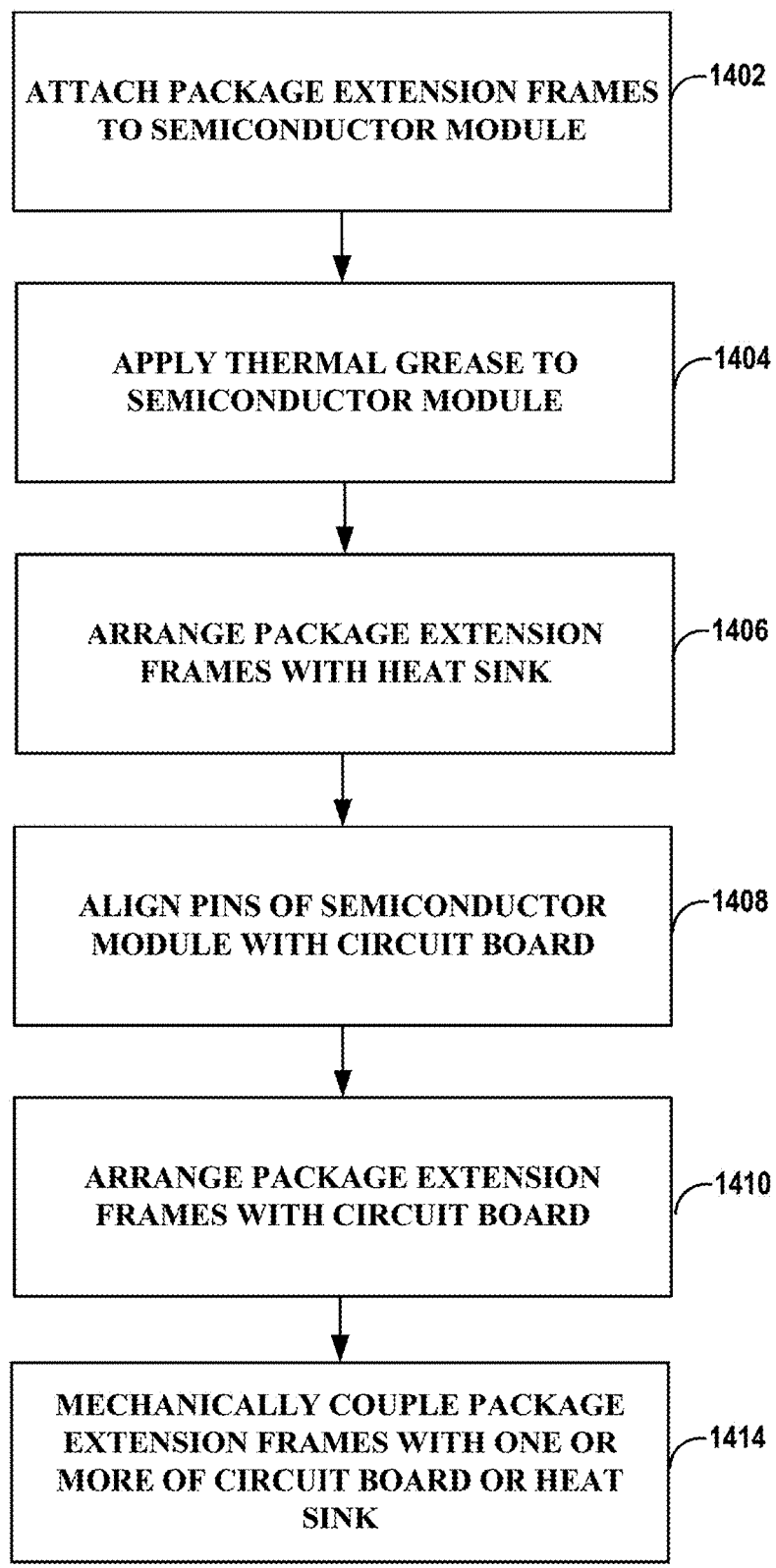
FIG. 14 is a flow diagram for a third method for providing a semiconductor package for simplified mounting, in accordance with one or more techniques of this disclosure.

FIG. 14 is a flow diagram for a third method for providing a semiconductor package for simplified mounting, in accordance with one or more techniques of this disclosure. For purposes of illustration only, FIG. 14 is described below within the context of FIGS. 1A-1B, 2-7, 8A-8C, 9, 10, and 11A-11D.

Initially, the method includes attaching package extension frames to a semiconductor module (1402). For example, package extension frames 804 may be attached using a fish-hook coupling by pressing package extension frames 804 into respective side surfaces 820 of semiconductor module 802. In some examples, package extension frame 1004 is rotated with respect to semiconductor module 902. The method includes applying thermal grease to the semiconductor module (1404).

The method includes arranging the package extensions frames with the heat sink (1406). For example, first package extension frame 804A and second package extension frame 804B are arranged with heat sink 808 such that second major surface 824 of semiconductor module 802 faces heat sink 808.

The method includes aligning pins of the semiconductor module with a circuit board (1408). For example, alignment holes 874A may be aligned with alignment holes 872A and alignment holes 874B may be aligned with alignment holes 872B. In this example, aligning alignment holes 874A with alignment holes 872A and/or alignment holes 874B with alignment holes 872B may help to ensure that pins 842 are aligned with pin receptacles 875.

The method includes arranging the package extensions frames with the circuit board (1410). For example, first major surface 822 of semiconductor module 802 is press fitted into circuit board 806 using first package extension frame 804A and second package extension frame 804B.

The method includes mechanically coupling the package extension frames with one or more of the circuit board and/or the heat sink (1414). For example, fasteners 110 may be configured to mechanically couple first package extension frame 104A and second package extension frame 104B to circuit board 106 and heat sink 108. In some examples, fastener 410A is configured to mechanically couple first package extension frame 404 to circuit board 406. In this example, fastener 410C is configured to mechanically couple first package extension frame 404 to heat sink 408. In some examples, fastener 510A is configured to mechanically couple first package extension frame 504 to heat sink 508. In this example, fastener 510C is configured to mechanically couple circuit board 506 to heat sink 508. In some examples, fastener 610A is configured to mechanically couple first package extension frame 604 to heat sink 608. In this example, fastener 610C is configured to mechanically couple circuit board 606 to heat sink 608.

While a semiconductor package has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The following examples may illustrate one or more aspects of the disclosure.

Example 1

A semiconductor package comprising: a semiconductor module comprising a first side surface, a second side surface, a first major surface, and a second major surface on an opposite side of the semiconductor module from the first major surface; a first package extension frame configured to attach to the first side surface; a second package extension frame configured to attach to the second side surface; and a first plurality of fasteners configured to mechanically couple the first package extension frame and the second package extension frame to one or more of a circuit board arranged on the first major surface and/or a heat sink arranged on the second major surface.

Example 2

The semiconductor package of example 1, wherein the plurality of fasteners are configured to mechanically couple the first package extension frame and the second package extension frame to the circuit board.

Example 3

The semiconductor package of any combination of examples 1-2, wherein the plurality of fasteners are configured to mechanically couple the first package extension frame and the second package extension frame to the heat sink.

Example 4

The semiconductor package of any combination of examples 1-3, wherein the plurality of fasteners are configured to mechanically couple the first package extension frame and the second package extension frame to the circuit board and the heat sink.

Example 5

The semiconductor package of any combination of examples 1-4, wherein the circuit board comprises a first plurality of alignment holes; and wherein the semiconductor module comprises a second plurality of alignment holes arranged to correspond with the first plurality of alignment holes.

Example 6

The semiconductor package of any combination of examples 1-5, wherein the first package extension frame comprises a third plurality of alignment holes arranged to correspond with two or more corresponding alignment holes of the first plurality of alignment holes; and wherein the second package extension frame comprises a fourth plurality of alignment holes arranged to correspond with two or more corresponding alignment holes of the first plurality of alignment holes.

Example 7

The semiconductor package of any combination of examples 1-6, wherein the first side surface comprises a mechanical coupling; and wherein the first package extension frame comprises a complementary mechanical coupling that when contacting the mechanical coupling couples the first package extension frame to the first side surface.

Example 8

The semiconductor package of any combination of examples 1-7, wherein the first package extension frame comprises a frame portion formed of a material different from a material of the complementary mechanical coupling.

Example 9

The semiconductor package of any combination of examples 1-8, wherein the circuit board comprises a first plurality of alignment holes; and wherein the first package extension frame comprises a second plurality of alignment holes arranged to correspond with the first plurality of alignment holes.

Example 10

The semiconductor package of any combination of examples 1-9, wherein the semiconductor module includes only two package extension frames, the two package extension frames including the first package extension frame and the second package extension frame.

Example 11

The semiconductor package of any combination of examples 1-10, wherein the semiconductor module further comprises a third side surface and a fourth side surface, the semiconductor package further comprising: a third package extension frame configured to attach to the third side surface; and/or a fourth package extension frame configured to attach to the fourth side surface.

Example 12

A method comprising: attaching a first package extension frame to a first side surface of a semiconductor module; attaching a second package extension frame to a second side surface of the semiconductor module; arranging the first package extension frame and the second package extension frame with a circuit board such that a first major surface of the semiconductor module faces the circuit board; arranging the first package extension frame and the second package extension frame with a heat sink such that a second major surface of the semiconductor module faces the heat sink; mechanically coupling, with one or more fasteners, the first package extension frame to one or more of the circuit board and/or the heat sink; and mechanically coupling, with the one or more fasteners, the second package extension frame to one or more of the circuit board and/or the heat sink.

Example 13

The method of example 12, wherein the semiconductor module comprises a plurality of pins extending away from the first major surface, the method further comprising aligning the plurality of pins with a plurality of pin receptacles of the circuit board prior to arranging the first package extension frame and the second package extension frame with the circuit board and/or heat sink.

Example 14

The method of any combination of examples 12-13, wherein the circuit board comprises a first plurality of alignment holes; wherein the first package extension frame comprises a second plurality of alignment holes; and wherein aligning the plurality of pins with the plurality of pin receptacles comprises aligning the second plurality of alignment holes with two or more corresponding alignment holes of the first plurality of alignment holes.

Example 15

The device of any combination of examples 12-14, wherein the semiconductor module comprises a third plurality of alignment holes; and wherein aligning the plurality of pins with the plurality of pin receptacles further comprises aligning the third plurality of alignment holes with the first plurality of alignment holes.

Example 16

The method of any combination of examples 12-15, wherein attaching the first package extension frame to the first side surface comprises pressing the first package extension frame into the first side surface or rotating the first package extension frame with respect to the semiconductor module; and wherein attaching the second package extension frame to the second side surface comprises pressing the second package extension frame into the second side surface or rotating the second package extension frame with respect to the semiconductor module.

Example 17

The method of any combination of examples 12-16, further comprising: attaching a third package extension frame to a third side surface of the semiconductor module; attaching a fourth package extension frame to a fourth side surface of the semiconductor module, wherein arranging the first package extension frame and the second package extension frame with a circuit board comprises arranging the first package extension frame, the second package extension frame, the third package extension frame, and the fourth package extension frame with the circuit board such that the first major surface of the semiconductor module faces the circuit board.

Example 18

The method of any combination of examples 12-17, wherein arranging the first package extension frame and the second package extension frame with the circuit board comprises fitting the first major surface of the semiconductor module into the circuit board using the first package extension frame and the second package extension frame.

Example 19

The method of any combination of examples 12-18, further comprising: applying thermal grease to the second major surface of the semiconductor module prior to arranging the first package extension frame and the second package extension frame with the heat sink.

Example 20

A circuit package system comprising: a semiconductor module comprising a first side surface, a second side surface, a first major surface, and a second major surface on an opposite side of the semiconductor module from the first major surface; a first package extension frame attached to the first side surface; a second package extension frame attached to the second side surface; a circuit board arranged on the first major surface; a heat sink arranged on the second major surface; and a plurality of fasteners mechanically coupling the first package extension frame and the second package extension frame to one or more of the circuit board or the heat sink.

Various aspects have been described in this disclosure. These and other aspects are within the scope of the following claims.

The invention claimed is:

1. A semiconductor package comprising:
a semiconductor module comprising a first side surface, a second side surface, a first major surface, and a second major surface on an opposite side of the semiconductor module from the first major surface;
a first package extension frame configured to attach to the first side surface;
a second package extension frame configured to attach to the second side surface; and
a plurality of fasteners configured to mechanically couple the first package extension frame and the second package extension frame to one or more of a circuit board arranged on the first major surface and/or a heat sink arranged on the second major surface.

2. The semiconductor package of claim 1, wherein the plurality of fasteners are configured to mechanically couple the first package extension frame and the second package extension frame to the circuit board.

3. The semiconductor package of claim 1, wherein the plurality of fasteners are configured to mechanically couple the first package extension frame and the second package extension frame to the heat sink.

4. The semiconductor package of claim 1, wherein the plurality of fasteners are configured to mechanically couple the first package extension frame and the second package extension frame to the circuit board and the heat sink.

5. The semiconductor package of claim 1,
wherein the circuit board comprises a first plurality of alignment holes; and
wherein the semiconductor module comprises a second plurality of alignment holes arranged to correspond with the first plurality of alignment holes.

6. The semiconductor package of claim 5,
wherein the first package extension frame comprises a third plurality of alignment holes arranged to correspond with two or more corresponding alignment holes of the first plurality of alignment holes; and
wherein the second package extension frame comprises a fourth plurality of alignment holes arranged to correspond with two or more corresponding alignment holes of the first plurality of alignment holes.

7. The semiconductor package of claim 1,
wherein the first side surface comprises a mechanical coupling; and
wherein the first package extension frame comprises a complementary mechanical coupling that when contacting the mechanical coupling couples the first package extension frame to the first side surface.

8. The semiconductor package of claim 7, wherein the first package extension frame comprises a frame portion formed of a material different from a material of the complementary mechanical coupling.

9. The semiconductor package of claim 1,
wherein the circuit board comprises a first plurality of alignment holes; and
wherein the first package extension frame comprises a second plurality of alignment holes arranged to correspond with the first plurality of alignment holes.

10. The semiconductor package of claim 1, wherein the semiconductor module includes only two package extension frames, the two package extension frames including the first package extension frame and the second package extension frame.

11. The semiconductor package of claim 1, wherein the semiconductor module further comprises a third side surface and a fourth side surface, the semiconductor package further comprising:
a third package extension frame configured to attach to the third side surface; and/or
a fourth package extension frame configured to attach to the fourth side surface.

12. A method comprising:
attaching a first package extension frame to a first side surface of a semiconductor module;
attaching a second package extension frame to a second side surface of the semiconductor module;
arranging the first package extension frame and the second package extension frame with a circuit board such that a first major surface of the semiconductor module faces the circuit board;
arranging the first package extension frame and the second package extension frame with a heat sink such that a second major surface of the semiconductor module faces the heat sink;
mechanically coupling, with one or more fasteners, the first package extension frame to one or more of the circuit board and/or the heat sink; and
mechanically coupling, with the one or more fasteners, the second package extension frame to one or more of the circuit board and/or the heat sink.

13. The method of claim 12, wherein the semiconductor module comprises a plurality of pins extending away from the first major surface, the method further comprising aligning the plurality of pins with a plurality of pin receptacles of the circuit board prior to arranging the first package extension frame and the second package extension frame with the circuit board and/or heat sink.

14. The method of claim 13,
wherein the circuit board comprises a first plurality of alignment holes;
wherein the first package extension frame comprises a second plurality of alignment holes; and
wherein aligning the plurality of pins with the plurality of pin receptacles comprises aligning the second plurality of alignment holes with two or more corresponding alignment holes of the first plurality of alignment holes.

15. The method of claim 14,
wherein the semiconductor module comprises a third plurality of alignment holes; and
wherein aligning the plurality of pins with the plurality of pin receptacles further comprises aligning the third plurality of alignment holes with the first plurality of alignment holes.

16. The method of claim 12,
wherein attaching the first package extension frame to the first side surface comprises pressing the first package extension frame into the first side surface or rotating the first package extension frame with respect to the semiconductor module; and
wherein attaching the second package extension frame to the second side surface comprises pressing the second package extension frame into the second side surface or rotating the second package extension frame with respect to the semiconductor module.

17. The method of claim 12, further comprising:
attaching a third package extension frame to a third side surface of the semiconductor module;
attaching a fourth package extension frame to a fourth side surface of the semiconductor module, wherein arranging the first package extension frame and the second package extension frame with a circuit board comprises arranging the first package extension frame, the second package extension frame, the third package extension frame, and the fourth package extension frame with the circuit board such that the first major surface of the semiconductor module faces the circuit board.

18. The method of claim 12, wherein arranging the first package extension frame and the second package extension frame with the circuit board comprises fitting the first major surface of the semiconductor module into the circuit board using the first package extension frame and the second package extension frame.

19. The method of claim 12, further comprising:
applying thermal grease to the second major surface of the semiconductor module prior to arranging the first package extension frame and the second package extension frame with the heat sink.

20. A circuit package system comprising:
a semiconductor module comprising a first side surface, a second side surface, a first major surface, and a second major surface on an opposite side of the semiconductor module from the first major surface;
a first package extension frame attached to the first side surface;
a second package extension frame attached to the second side surface;
a circuit board arranged on the first major surface;
a heat sink arranged on the second major surface; and
a plurality of fasteners mechanically coupling the first package extension frame and the second package extension frame to one or more of the circuit board or the heat sink.

* * * * *